US006917555B2

(12) United States Patent
Bedwell et al.

(10) Patent No.: US 6,917,555 B2
(45) Date of Patent: Jul. 12, 2005

(54) INTEGRATED CIRCUIT POWER MANAGEMENT FOR REDUCING LEAKAGE CURRENT IN CIRCUIT ARRAYS AND METHOD THEREFOR

(75) Inventors: Ryan D. Bedwell, Kyle, TX (US); Christopher K. Y. Chun, Austin, TX (US); Qadeer A. Qureshi, Dripping Springs, TX (US); John J. Vaglica, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 92 days.

(21) Appl. No.: 10/675,005

(22) Filed: Sep. 30, 2003

(65) Prior Publication Data

US 2005/0068799 A1 Mar. 31, 2005

(51) Int. Cl.[7] .................................................. G11C 7/00
(52) U.S. Cl. ...................................... 365/226; 365/227
(58) Field of Search ................................ 365/226, 227; 326/121

(56) References Cited

U.S. PATENT DOCUMENTS

| 5,848,428 A | 12/1998 | Collins |
| 6,208,171 B1 * | 3/2001 | Kumagai et al. ........... 326/121 |
| 6,597,620 B1 * | 7/2003 | McMinn ..................... 365/226 |
| 2003/0061448 A1 | 3/2003 | Rawson, III |

OTHER PUBLICATIONS

Agarwal et al., "DRG–Cache: A Data Retention Gated–Ground Cache for Low Power," *DAC 2002*, Jun. 10–14, 2001, New Orleans, Louisiana, USA, pp. 473–478.

Flautner et al., "Drowsy Caches: Simple Techniques for Reducing Leakage Power," 2002 IEEE, 1063–6897/02, pp. 148–157.

Kaxiras et al., "Cache Decay: Exploiting Generational Behavior to Reduce Cache Leakage Power," *2001 IEEE*, 0–7695–1162, Jul. 2001, 12 pgs.

Kim et al., "Drowsy Instruction Caches—Leakage Power Reduction Using Dynamic Voltage Scaling and Cache Sub-bank Prediction," *Proceedings of the 35th Annual IEEE/ACM International Symposium on Microarchitecture*, 1072–4451, 2002, 12 pgs.

Kim et al., "Partitioned Instruction Cache Architecture for Energy Efficiency," *ACM Transactions on Embedded Computing Systems*, vol. 2, No. 2, May 2003, pp. 163–185.

Powell et al., "Gated–$V_{dd}$: A Circuit Technique to Reduce Leakage in Deep–Submicron Cache Memories," *ISLPED '00*, Rapallo, Italy, pp. 90–95.

Yang et al., "An Integrated Circuit/Architecture Approach to Reducing Leakage in Deep–Submicron High–Performance I–Caches," *IEEE*, 0–7695–1019, Jan. 2001, pp. 147–157.

* cited by examiner

*Primary Examiner*—Son T. Dinh
(74) *Attorney, Agent, or Firm*—Michael J. Balconi-Lamica

(57) ABSTRACT

Leakage current is eliminated in a memory array during a low power mode of a processing system having a processor that interfaces with the memory array. Because two power planes are created, the processor may continue executing instructions using a system memory while bypassing the memory array when the array is powered down. A switch selectively removes electrical connectivity to a supply voltage terminal in response to either processor-initiated control resulting from execution of an instruction or from a source originating in the system somewhere else than the processor. Upon restoration of power to the memory array, data may or may not need to be marked as unusable depending upon which of the two power planes supporting arrays to the memory array are located. Predetermined criteria may be used to control the timing of the restoration of power. Multiple arrays may be implemented to independently reduce leakage current.

26 Claims, 3 Drawing Sheets

INTEGRATED CIRCUIT POWER MANAGEMENT FOR REDUCING LEAKAGE CURRENT IN CIRCUIT ARRAYS AND METHOD THEREFOR

BACKGROUND

1. Field of the Invention

The present invention relates generally to integrated circuits and method of making the same, and more particularly, to integrated circuit power management for reducing leakage current in circuit arrays and method therefor.

2. Related Art

Battery-powered devices that incorporate integrated circuits, such as cell phones, personal digital assistants, handheld computing devices, and other similar type wireless and/or mobile electronic devices, are very sensitive to power consumption. As technology moves to the 90 nm process technology node and beyond, static leakage current within the integrated circuit of a battery-powered device becomes a major concern with respect to times when the device is powered but not actively used.

Accordingly, an improved integrated circuit and method of making the same is desired.

SUMMARY

According to one embodiment, an integrated circuit includes processing circuitry, at least one memory array, and control circuitry. The processing circuitry executes instructions. The at least one memory array couples to the processing circuitry for providing data to the processing circuitry. Lastly, the control circuitry couples to the at least one memory array, wherein the control circuitry removes electrical connectivity of the at least one memory array to a supply voltage terminal by firstly disabling all accesses to the at least one memory array and secondly removing electrical power to all of the at least one memory array to reduce leakage current in the at least one memory array.

BRIEF DESCRIPTION OF THE DRAWINGS

The embodiments of the present disclosure are illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

Powering off of memory arrays of an integrated circuit during low-power modes according to the embodiments of the present disclosure can save significant leakage current. One example of an application of the present disclosure is the powering off of the data arrays of on-chip cache memories and other memory arrays. According to the embodiments of the present disclosure, powering off of memory arrays results in no loss of functionality. The powering off of memory arrays produces only some performance degradation. Performance degradation is due to one or more of the following: the need to flush the memory array prior to powering the memory array off; the need to ensure that all entries are invalid when the memory array is powered back up; and re-population of the memory array after power-up to a level similar to that before power-down.

The embodiments of the present disclosure include details for hardware and software requirements of methods for accomplishing a power-down sequence for a memory array, such as a cache memory array. The methods are equally applicable to any level of cache. However the methods differ in the point of control; one is software-controlled, the other is hardware-controlled. Furthermore, the methods can be simultaneously supported to allow a maximum flexibility.

In one embodiment, the method allows cache data arrays to be powered off during low-power modes or during long periods of extremely low processing requirements, inactivity, or limited inactivity. An example of an extremely low processing requirement for a device could include processing requirements for an idle cell phone. Uniqueness of the embodiments of the present disclosure resides partially in the fact that the cache arrays are powered off without having power to the corresponding processing core powered off, with the accompanying savings and restoring of states. In one embodiment, the method includes a whole-cache bypass and array power control using a single transistor. In one embodiment, the whole-cache power control provides for optimizing leakage reduction, with very little hardware overhead, and furthermore still allowing deterministic behavior by allowing explicit software control.

Figure 1:
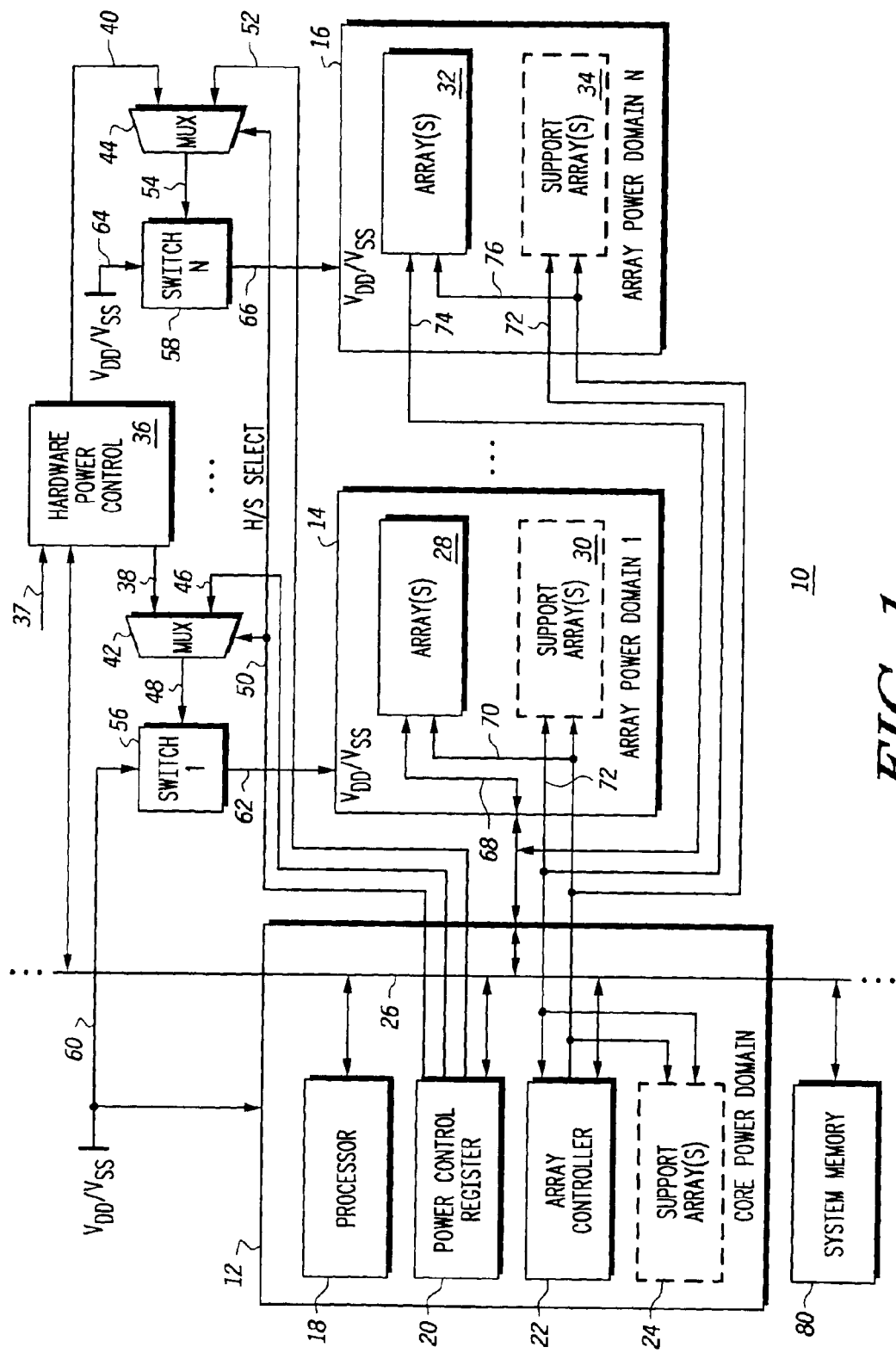
FIG. 1 is a block diagram view of an integrated circuit with power management for reducing leakage current in circuit arrays according to an embodiment of the present disclosure.

Referring now to FIG. 1, the figure illustrates a block diagram view of an integrated circuit 10 with power management for reducing leakage current in circuit arrays according to an embodiment of the present disclosure. Integrated circuit 10 includes a core power domain 12 and one or more array power domains (1 to N, where N is an integer), for example, as indicated in FIG. 1 by reference numerals 14 and 16. The core power domain 12 includes processor (or processing circuitry) 18, power control register 20, and array controller 22. Core power domain 12 may also include one or more support arrays 24, for example, a tag array, a dirty array, a valid array, or combination(s) thereof. A system bus 26 couples processor 18, power control register 20, array controller 22, and other system devices or functions, such as, hardware power control 36, system memory 80, or others (not shown).

Array power domain 14 includes one or more array(s) 28 and may also include one or more support array(s) 30, for example, a tag array, a dirty array, a valid array, or combination(s) thereof. Array power domain 16 includes one or more array(s) 32 and may also include one or more support array(s) 34, for example, a tag array, a dirty array, a valid array, or combination(s) thereof.

Integrated circuit 10 further includes hardware power control 36. Hardware power control 36 provides at least up to N hardware power control outputs, for example, hardware power control outputs 38 and 40. Hardware power control 36 also includes a control input 37 configured to receive one or more power control signal(s).

In addition, integrated circuit 10 includes at least up to N power switch control multiplexers (MUXs), for example, MUX 42 and MUX 44. In one embodiment, MUX 42 includes a 2:1 multiplexer having inputs 38 and 46 and an output 48. A select input 50 driven by an output of power control register 20 controls which of the inputs 38 or 46 is passed to the MUX 42 output 48. In one embodiment, input 38 corresponds to one output of hardware power control 36 and input 46 corresponds to one output of power control register 20. MUX 44 includes a 2:1 multiplexer having inputs 40 and 52 and an output 54. A select input 50 driven by an output of power control register 20 controls which of the inputs 40 or 52 is passed to the MUX 44 output 54. In one embodiment, input 40 corresponds to another output of hardware power control 36 and input 52 corresponds to another output of power control register 20.

Still further, integrated circuit 10 also includes at least up to N switches, for example, switch 56 and switch 58. In one embodiment, switches 56 and 58 can comprise PFETs, NFETs, or other suitable transistor switching devices. Switch 56 has an input 60 and an output 62, wherein connectivity from input to output is controlled by the output 48 of MUX 42. Similarly, switch 58 has an input 64 and an output 66, wherein connectivity from input to output is controlled by the output 54 of MUX 44. A supply voltage terminal provides a voltage $V_{DD}$ or $V_{SS}$ to core power domain 12 and to the N switches, for example, corresponding to input 60 of switch 56 and input 64 of switch 58. The switch output 62 of switch 56 is coupled to a power plane terminal $V_{DD}/V_{SS}$ of array power domain 14. Similarly, the switch output 66 is coupled to a power plane terminal $V_{DD}/V_{SS}$ of array power domain 16.

For clarity of illustration, the core power domain 12 has been shown as including the processor 18, power control register 20, array controller 22 and support array(s) 24. However, the hardware power control 36, MUXs (42,44), switches (56,58), and system memory 80 may also or may not also be included within the core power domain 12.

Referring still to FIG. 1, array(s) 28 of array power domain 14 receives and/or sends data across the system bus 26 via data lines 68. Array controller 22 provides address and control signals for the array(s) 28 and/or support array(s) 30 via signal lines 70. In addition, support array(s) 30 receives and/or sends data from/to array controller 22 via signal lines 72. Signal lines 72 include one or more buses as may be required for a particular integrated circuit implementation. Furthermore, array(s) 32 of array power domain 16 receives and/or sends data across the system bus 26 via data lines 74. Array controller 22 provides address and control signals for the array(s) 32 and/or support array(s) 34 via signal lines 76. Furthermore, support array(s) 34 receives and/or sends data from/to array controller 22 via signal lines 72.

Figure 2:
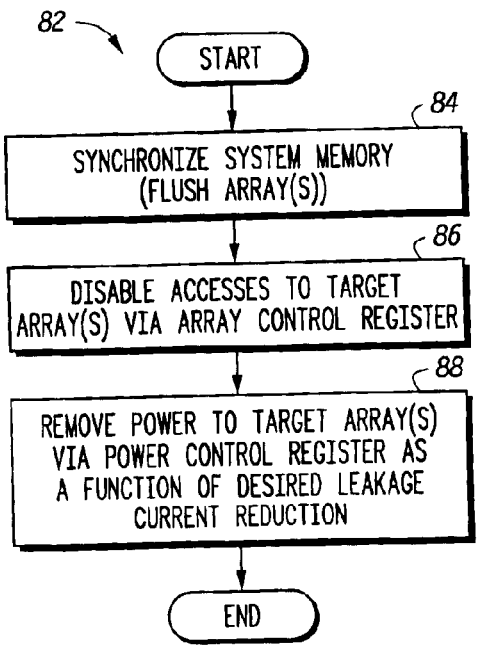
FIG. 2 is a flow diagram view of an array(s) power-down sequence under software control according to another embodiment of the present disclosure.

FIG. 2 is a flow diagram view of an array(s) power-down sequence 82 under software control according to one embodiment of the present disclosure. The array(s) power-down sequence 82 can be executed at any time in which processor 18 is able to execute instructions during operation of integrated circuit 10. The target array or arrays are those array/arrays to be powered down for achieving a desired reduction in overall leakage current of integrated circuit 10. The target array or arrays can include one or more of arrays 28 and 32, one or more support arrays 30 and 34, or any combinations thereof. The actual selection of the target array(s) is based upon selection criteria relating to leakage savings and performance impact of the array(s) in a particular integrated circuit implementation. At step 84 of sequence 82, processor 18 synchronizes system memory 80 with contents of the target array(s). In one embodiment, synchronizing system memory may entail the flushing of a cache memory. Cache memory may include an L1, L2, L3, or other similar type memory. Subsequent to synchronizing system memory, at step 86, processor 18 disables access to the target array(s) via array control register 22. In an embodiment using a cache array, disabling access can include placing the cache array in a by-pass mode, wherein all subsequent cache memory requests are passed to a next level of memory.

Finally, in step 88, processor 18 removes power to the target array(s) as a function of the desired leakage current reduction by writing to the power control register 20, instructing power control register 20 to de-assert one or more corresponding software power control signals of the target array(s). As a result, connectivity of one or more corresponding switches is interrupted. For example, in FIG. 1, if the target array includes one or more of array(s) within array power domain 14, then processor 18 would instruct power control register 20 to de-assert software power control signal 46 while driving hardware/software select line 50 to the software select state, thus causing connectivity between the input and output of switch 56 to be interrupted.

Figure 3:
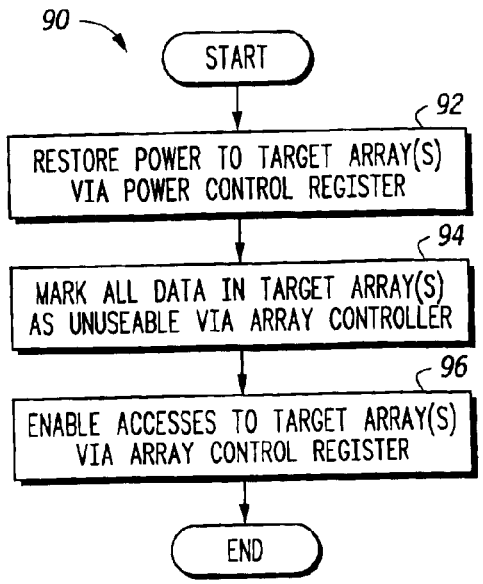
FIG. 3 is a flow diagram view of an array(s) power-up sequence under software control according to the embodiment corresponding to FIG. 2.

FIG. 3 is a flow diagram view of an array(s) power-up sequence 90 under software control according to the embodiment corresponding to FIG. 2. The array(s) power-up sequence 90 can be executed at any time in which processor 18 is able to execute instructions during operation of integrated circuit 10. For the power-up sequence 90, the target array or arrays are those array/arrays to be powered up to an active operating mode. The target array or arrays can include one or more of arrays 28 and 32, one or more support arrays 30 and 34, or any combinations thereof.

In step 92, processor 18 restores power to the target array(s) by writing to the power control register 20, instructing power control register 20 to assert one or more corresponding software power control signals of the target array(s). As a result, connectivity of one or more corresponding switches is established. For example, in FIG. 1, if the target array includes one or more of array(s) within array power domain 14, then processor 18 would instruct power control register 20 to assert software power control signal 46 while driving hardware/software select line 50 to the software select state, thus causing connectivity between the input and output of switch 56 to be established.

At step 94 of sequence 90, processor 18 marks all data in the target array(s) as unusable via array controller 22, because the contents of the target array would be unknown, and hence, unusable. In one embodiment, marking all data in the target array(s) as unusable may entail invalidating the contents of a cache memory. As indicated above, cache memory may include an L1, L2, L3, or other similar type memory. Subsequent to marking the data as unusable, at step 96, processor 18 enables access to the target array(s) via array control register 22. In an embodiment using a cache array, enabling access can include placing the cache array in an operational mode, wherein all subsequent cache memory requests are evaluated by the cache memory for servicing according to the then current contents of the cache memory.

Figure 4:
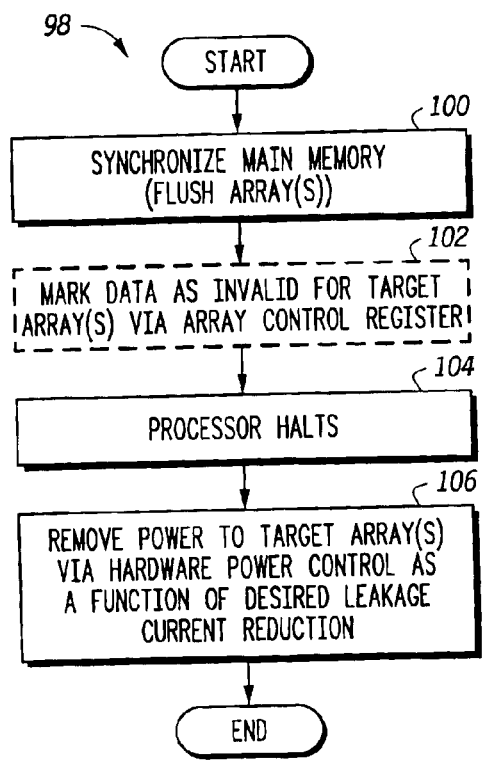
FIG. 4 is a flow diagram view of an array(s) power-down sequence under hardware control according to yet another embodiment of the present disclosure.

FIG. 4 is a flow diagram view of an array(s) power-down sequence 98 under hardware control according to yet another embodiment of the present disclosure. Prior to execution of sequence 98, processor 18 configures the corresponding power control MUXs for hardware power control. For example, in FIG. 1, if the target array(s) were part of array power domain 14, then processor 18 would instruct power control register 20 to drive the hardware/software select line 50 to the hardware select state. Accordingly, input 38 is passed to output 48 of MUX 42.

The array(s) power-down sequence 98 is executed as part of an integrated circuit system wide, or sub-system wide, low-power mode entry sequence for causing the integrated circuit system or sub-system to enter a power savings mode which is outside the scope of the present embodiments. The target array or arrays are those array/arrays to be powered down for achieving a desired reduction in overall leakage current of integrated circuit 10. The target array or arrays can include one or more of arrays 28 and 32, one or more support arrays 30 and 34, or any combinations thereof. The selection criteria for the target array(s) is similar to that as mentioned herein above.

At step 100 of sequence 98, processor 18 synchronizes system memory 80 with contents of the target array(s). In one embodiment, synchronizing system memory may entail the flushing of a cache memory. Cache memory may include an L1, L2, L3, or other similar type memory. Subsequent to synchronizing system memory, at step 102, processor 18 optionally marks all data in the target array(s) as unusable via array controller 22. In one embodiment, marking all data in the target array(s) as unusable may entail invalidating the contents of a cache memory. As indicated above, cache memory may include an L1, L2, L3, or other similar type memory. At some period of time subsequent to marking the data as unusable, at step 104, processor 18 halts by execution of an appropriate instruction.

At step 106, power hardware control 36 removes power to the target array(s) as a function of the desired leakage current reduction by de-asserting one or more corresponding hardware power control signals of the target array(s). As a result, connectivity of one or more corresponding switches is interrupted. For example, in FIG. 1, if the target array includes one or more of array(s) within array power domain 14, then hardware power control 36 would de-assert hardware power control signal 38, thus causing connectivity between the input and output of switch 56 to be interrupted. This array(s) power-down sequence portion of the system or sub-system power savings mode entry sequence is then ended.

Figure 5:
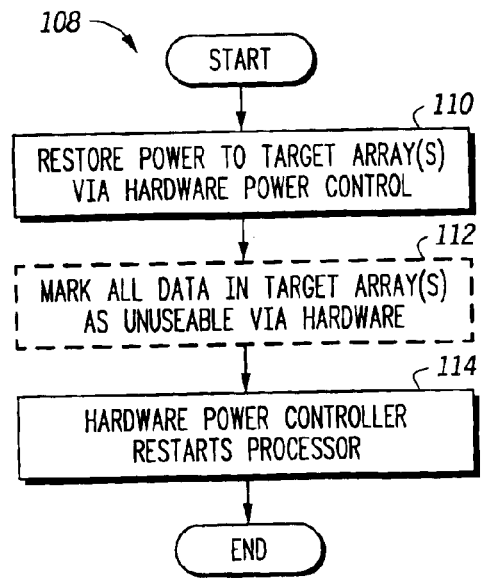
FIG. 5 is a flow diagram view of an array(s) power-up sequence under hardware control according to the embodiment corresponding to FIG. 4.

FIG. 5 is a flow diagram view of an array(s) power-up sequence 108 under hardware control according to the embodiment corresponding to FIG. 4. Prior to execution of sequence 108, processor 18 configures the corresponding power control MUXs for hardware power control. For example, in FIG. 1, if the target array(s) were part of array power domain 14, then processor 18 would instruct power control register 20 to drive the hardware/software select line 50 to the hardware select state. Accordingly, input 38 is passed to output 48 of MUX 42.

The array(s) power-up sequence 108 is executed at as part of an integrated circuit system wide, or sub-system wide, low-power mode exit sequence for causing the integrated circuit system or sub-system to exit a power savings mode which is outside the scope of the present embodiments. For the power-up sequence 108, the target array or arrays are those array/arrays to be powered up to an active operating mode. The target array or arrays can include one or more of arrays 28 and 32, one or more support arrays 30 and 34, or any combinations thereof.

In step 110, hardware power control 36 restores power to the target array(s) by asserting one or more corresponding hardware power control signals of the target array(s). As a result, connectivity of one or more corresponding switches is established. For example, in FIG. 1, if the target array includes one or more of array(s) within array power domain 14, then hardware power control 36 would assert hardware power control signal 38, thus causing connectivity between the input and output of switch 56 to be established.

Subsequent to restoration of power to the target array(s), at step 112 of sequence 108, invalidation hardware optionally marks all data in the target array(s) as unusable. In one embodiment, the invalidation hardware comprises a support array, such as a cache valid array, having a zero-ize input as discussed hereafter with respect to FIG. 6. The zero-ize input operates to reset the state of all bits in the corresponding support array to a known value, wherein the hardware power control 36 drives the zero-ize input.

Subsequent to marking the data as unusable, at step 114, hardware power control 36, or a different hardware power control element not specifically disclosed herein, restarts processor 18. In an embodiment using a cache array, all subsequent accesses by processor 18 are evaluated by the cache memory for servicing according to the then current contents of the cache memory.

Figure 6:
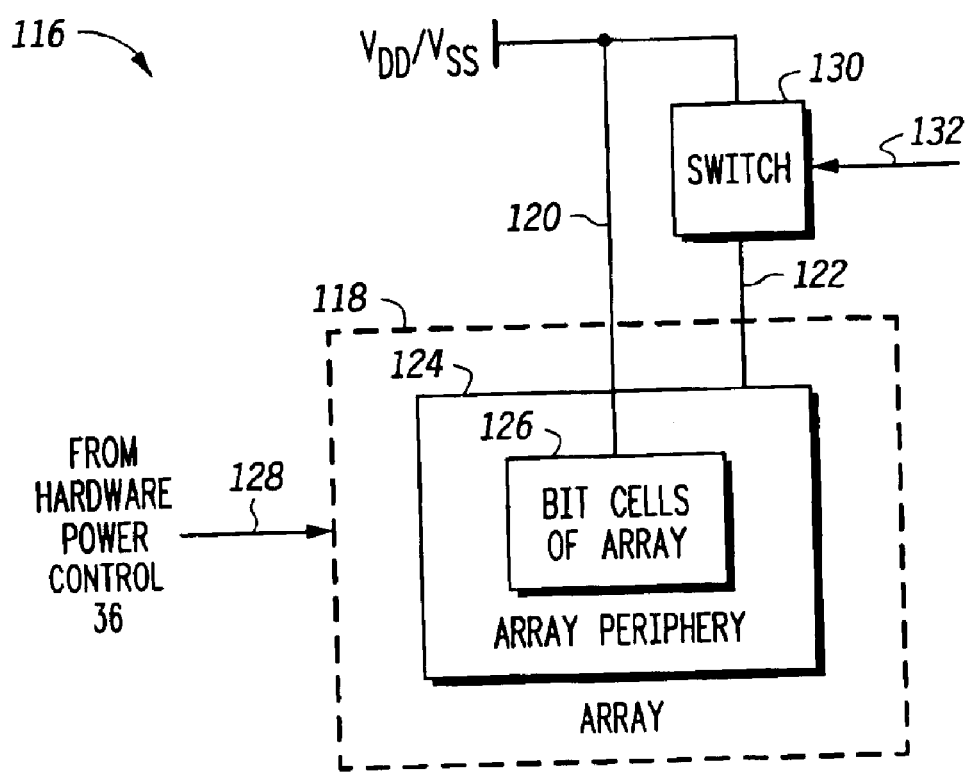
FIG. 6 is a block diagram view of a portion of the integrated circuit of FIG. 1 in greater detail according to yet another embodiment of the present disclosure.

FIG. 6 is a block diagram view of a portion of the integrated circuit 10 of FIG. 1 in greater detail according to yet another embodiment of the present disclosure. For example, one or more of array(s) 28, 30, 32, or 34 could include a configuration 116 having an array 118 with separate power terminals (120,122) respectively for a corresponding array periphery 124 and for the corresponding bit cells 126, and/or a zero-ize input 128. In this configuration, the bit cells 126 remain powered while power for the array periphery 124 is switched by switch 130, further as controlled by signal 132 from a corresponding power switch control MUX, such as, MUX 42, 44, or other power switch control MUX.

Further to the above discussion, in one embodiment an integrated circuit having power management includes processing circuitry, at least one memory array, and control circuitry. The processing circuitry executes instructions. The at least one memory array couples to the processing circuitry for providing data to the processing circuitry. Lastly, the control circuitry couples to the at least one memory array, wherein the control circuitry removes electrical connectivity of the at least one memory array to a supply voltage terminal by firstly disabling all accesses to the at least one memory array and secondly removing electrical power to all of the at least one memory array to reduce leakage current in the at least one memory array.

The integrated circuit may further include one or more supporting memory arrays coupled to the at least one memory array. The one or more supporting memory arrays provide a support function to operate a corresponding one of the at least one memory array. In addition, according to one embodiment, the control circuitry keeps the one or more supporting memory arrays selectively powered up when electrical power is removed to all of the at least one memory array depending upon whether all data in the at least one memory array must be marked as unusable upon restoring power to the at least one memory array.

In another embodiment, the integrated circuit is similar as that as described above, wherein the control circuitry further includes a switch having a first terminal coupled to the supply voltage terminal and a second terminal coupled to a power plane terminal of the at least one memory array. The switch also includes a control terminal for receiving a control signal that determines when the switch is conductive. The control signal can be provided in response to either execution of at least one instruction by the processing circuitry or in response to receipt by the processing circuitry of a power down signal. In addition, a configuration register stores a control value that determines whether the control signal is provided in response to execution of the at least one instruction or in response to the power down signal.

In yet another embodiment, the integrated circuit is similar as that as described above, wherein the integrated circuit further includes a plurality of memory arrays, each of the plurality of memory arrays being coupled to the control circuitry and being able to be independently entirely powered off to reduce transistor leakage current.

In still yet another embodiment, the integrated circuit is similar as that as described above, wherein the integrated circuit further includes a system memory coupled to the processing circuitry, wherein the control circuitry synchronizes the system memory by flushing the at least one memory array of stored data and physically halts the processing circuitry prior to removing power to the at least one memory array.

In another additional embodiment, the integrated circuit is similar as that as described above, wherein the integrated circuit further includes a system memory coupled to the processing circuitry, wherein contents of the at least one memory array are synchronized with the system memory and wherein the at least one memory array comprises a copy-back cache that is configured as a write-through cache so that the contents of the at least one memory array are always synchronized with the system memory.

In yet another additional embodiment, the integrated circuit is similar as that as described above, wherein the integrated circuit further includes a system memory coupled to the processing circuitry, wherein the control circuitry synchronizes the system memory by flushing the at least one memory array of stored data prior to disabling accesses to the at least one memory array under control of the processing circuitry for executing instructions and removing power to the at least one memory array. Furthermore, the integrated circuit further includes a control register coupled to the at least one memory array. The control register is configured for storing a command signal provided by the processing circuitry. The command signal disables accesses to the at least one memory array.

In still yet another embodiment, the integrated circuit is similar as that as described above, wherein the integrated circuit further includes a control register within the control circuitry. The control register receives and stores a command signal from the processing circuitry that functions to restore power to the at least one memory array. The control circuitry further comprises an array controller that marks all data entries in the at least one memory array with a predetermined bit value prior to the array controller enabling accesses to the at least one memory array.

In another embodiment, the integrated circuit is similar as that as described above, wherein the control circuitry restores power to the at least one memory array in response to a power up signal and marks all data entries in the at least one memory array as unusable prior to restarting the circuitry for executing instructions.

The control circuitry may further include monitoring logic that observes memory accesses of the at least one memory array during removing electrical power to all of the at least one memory array. The monitoring logic limits powering up of the at least one memory array in response to one or more memory requests until a predetermined criteria is met. In addition, the monitoring logic is configured to use differing predetermined criteria depending upon a sequence of instructions executed by the processing circuitry.

According to another embodiment, an integrated circuit having power management includes processing circuitry, a plurality of memory bit cells contained within a memory array, memory array peripheral circuitry, and control circuitry. The processing circuitry is configured to execute instructions. The plurality of memory bit cells contained within the memory array are coupled to a power supply terminal for creating a first power plane. The memory array peripheral circuitry is peripheral to the plurality of memory bit cells, wherein the memory array peripheral circuitry is selectively coupled to the power supply terminal for creating a second power plane that is independent of the first power plane. Lastly, the control circuitry is coupled to the memory array circuitry peripheral to the plurality of memory bit cells, wherein the control circuitry is configured to selectively remove electrical connectivity to the power supply terminal of the memory array peripheral circuitry that is peripheral to the plurality of memory bit cells.

In another embodiment, the control circuitry provides a control signal to selectively remove electrical connectivity, the control signal being provided in response to either execution of at least one instruction by the processing circuitry or in response to receipt by the processing circuitry of a power down signal. In another embodiment, the control circuitry halts the processing circuitry prior to removing power from the power supply terminal. Still further, in yet another embodiment, the control circuitry disables access to the plurality of memory bit cells prior to removing electrical connectivity to the power supply terminal of the memory array peripheral circuitry that is peripheral to the plurality of memory bit cells.

In another embodiment, the integrated circuit is similar as that as described above, wherein the integrated circuit further comprises monitoring logic. The monitoring logic is configured to observe memory accesses of the memory array during removing electrical power to all of the memory array. The monitoring logic is further configured to limit powering up of the memory array in response to one or more memory requests until a predetermined criteria is met. In addition, the monitoring logic uses differing predetermined criteria depending upon a sequence of instructions executed by the processing circuitry.

According to yet another embodiment, a method for reducing leakage current in an integrated circuit includes providing a first power plane of circuitry, the first power plane of circuitry comprising an array of memory cells, and providing a second power plane of circuitry, the second power plane of circuitry comprising a processor and control circuitry. The control circuitry removes electrical connectivity of the array of memory cells to a supply voltage terminal by firstly disabling all accesses to the array of memory cells and secondly removing electrical power to all of the array of memory cells to reduce leakage current in the array of memory cells.

The method can also include providing at least one supporting array of memory cells in either the first power plane of circuitry or the second power plane of circuitry for providing support functions to the array of memory cells. In one embodiment, when the at least one supporting array of memory cells is in the first power plane of circuitry, the supporting array of memory cells is not powered down when the second power plane of circuitry is powered down thereby keeping a record of validity status of bits in the array of memory cells.

The method may further include providing one or more additional power planes of circuitry coupled to the first power plane of circuitry. The one or more additional power planes of circuitry can comprise additional arrays of memory cells in which each additional array may be separately and completely powered down independently of whether the second power plane of circuitry is powered.

According to yet another embodiment, a method of power management in an integrated circuit includes executing instructions with a processor and providing a plurality of memory bit cells contained within a memory array. The plurality of memory bit cells are coupled to a power supply terminal for creating a first power plane. The method further includes providing memory array peripheral circuitry that is peripheral to the plurality of memory bit cells, selectively coupling the memory array peripheral circuitry to the power supply terminal for creating a second power plane that is independent of the first power plane. The method further includes coupling control circuitry to the memory array peripheral circuitry to the plurality of memory bit cells. Lastly, the method includes selectively removing electrical connectivity to the power supply voltage terminal of the memory array peripheral circuitry to the plurality of memory bit cells.

The method can further comprise observing memory accesses of the plurality of memory bit cells during removing of electrical power to all of the plurality of memory bit cells. In addition, the method includes limiting powering up of the plurality of memory bit cells in response to one or more memory requests until a predetermined criteria is met. Differing predetermined criteria can be used depending upon a sequence of instructions executed by the processor.

Programming of instructions to be processed by the processor or processing circuitry for carrying out the various functions and/or functionalities of the methods as discussed herein above can be performed using programming techniques well known in the art. For example, programming includes software modifications to a low-power mode entry/exit routine of a device incorporating an integrated circuit of the present embodiments and/or addition of software control code to the same.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

We claim:

1. An integrated circuit having power management comprising:
   processing circuitry for executing instructions;
   at least one memory array coupled to the processing circuitry for providing data to the processing circuitry; and
   control circuitry coupled to the at least one memory array, the control circuitry removing electrical connectivity of the at least one memory array to a supply voltage terminal by firstly disabling all accesses to the at least one memory array and secondly removing electrical power to all of the at least one memory array to reduce leakage current in the at least one memory array.

2. The integrated circuit of claim 1 further comprising:
   one or more supporting memory arrays coupled to the at least one memory array, the one or more supporting memory arrays providing a support function to operate the at least one memory array, the control circuitry keeping the one or more supporting memory arrays selectively powered up when electrical power is removed to all of the at least one memory array depending upon whether all data in the at least one memory array must be marked as unusable upon restoring power to the at least one memory array.

3. The integrated circuit of claim 1 wherein the control circuitry further comprises:
   a switch having a first terminal coupled to the supply voltage terminal and a second terminal coupled to a power plane terminal of the at least one memory array, the switch further comprising a control terminal for receiving a control signal that determines when the switch is conductive.

4. The integrated circuit of claim 3 wherein the control signal is provided in response to either execution of at least one instruction by the processing circuitry or in response to receipt by the processing circuitry of a power down signal.

5. The integrated circuit of claim 4 further comprising:
   a configuration register for storing a control value that determines whether the control signal is provided in response to execution of the at least one instruction or in response to the power down signal.

6. The integrated circuit of claim 1 further comprising:
   a plurality of memory arrays, each of the plurality of memory arrays being coupled to the control circuitry and being able to be independently entirely powered off to reduce transistor leakage current.

7. The integrated circuit of claim 1 further comprising:
   a system memory coupled to the processing circuitry, wherein the control circuitry synchronizes the system memory by flushing the at least one memory array of stored data and physically halts the processing circuitry prior to removing power to the at least one memory array.

8. The integrated circuit of claim 1 further comprising:
   a system memory coupled to the processing circuitry, wherein contents of the at least one memory array are synchronized with the system memory and wherein the at least one memory array comprises a copy-back cache that is configured as a write-through cache so that the contents of the at least one memory array are always synchronized with the system memory.

9. The integrated circuit of claim 1 further comprising:
   a system memory coupled to the processing circuitry, wherein the control circuitry synchronizes the system memory by flushing the at least one memory array of stored data prior to disabling accesses to the at least one memory array under control of the processing circuitry for executing instructions and removing power to the at least one memory array.

10. The integrated circuit of claim 9 further comprising:
a control register coupled to the at least one memory array, the control register storing a command signal provided by the processing circuitry for executing instructions, the command signal disabling accesses to the at least one memory array.

11. The integrated circuit of claim 1 further comprising:
a control register within the control circuitry, the control register receiving and storing a command signal from the processing circuitry for executing instructions that functions to restore power to the at least one memory array, the control circuitry further comprising an array controller that marks all data entries in the at least one memory array with a predetermined bit value prior to the array controller enabling accesses to the at least one memory array.

12. The integrated circuit of claim 1 wherein the control circuitry restores power to the at least one memory array in response to a power up signal and marks all data entries in the at least one memory array as unusable prior to restarting the circuitry for executing instructions.

13. The integrated circuit of claim 1 wherein the control circuitry further comprises monitoring logic that observes memory accesses of the at least one memory array during removing electrical power to all of the at least one memory array, the monitoring logic limiting powering up of the at least one memory array in response to one or more memory requests until a predetermined criteria is met.

14. The integrated circuit of claim 13 wherein the monitoring logic uses differing predetermined criteria depending upon a sequence of instructions executed by the processing circuitry.

15. An integrated circuit having power management comprising:
processing circuitry for executing instructions;
a plurality of memory bit cells contained within a memory array, the plurality of memory bit cells being coupled to a power supply terminal for creating a first power plane;
memory array peripheral circuitry that is peripheral to the plurality of memory bit cells, the memory array peripheral circuitry being selectively coupled to the power supply terminal for creating a second power plane that is independent of the first power plane; and
control circuitry coupled to the memory array peripheral circuitry that is peripheral to the plurality of memory bit cells, the control circuitry selectively removing electrical connectivity to the power supply terminal of the memory array peripheral circuitry that is peripheral to the plurality of memory bit cells.

16. The integrated circuit of claim 15 wherein the control circuitry provides a control signal to selectively remove electrical connectivity, the control signal being provided in response to either execution of at least one instruction by the processing circuitry or in response to receipt by the processing circuitry of a power down signal.

17. The integrated circuit of claim 15 wherein the control circuitry halts the processing circuitry prior to removing power from the power supply terminal.

18. The integrated circuit of claim 15 wherein the control circuitry disables access to the plurality of memory bit cells prior to removing electrical connectivity to the power supply terminal of the memory array peripheral circuitry that is peripheral to the plurality of memory bit cells.

19. The integrated circuit of claim 15 further comprising monitoring logic that observes memory accesses of the memory array during removing electrical power to the memory array peripheral circuitry that is peripheral to the plurality of memory bit cells, the monitoring logic limiting powering up of the memory array peripheral circuitry in response to one or more memory requests until a predetermined criteria is met.

20. The integrated circuit of claim 19 wherein the monitoring logic uses differing predetermined criteria depending upon a sequence of instructions executed by the processing circuitry.

21. A method for reducing leakage current in an integrated circuit comprising:
providing a first power plane of circuitry, the first power plane of circuitry comprising an array of memory cells; and
providing a second power plane of circuitry, the second power plan of circuitry comprising a processor and control circuitry, the control circuitry removing electrical connectivity of the array of memory cells to a supply voltage terminal by firstly disabling all accesses to the array of memory cells and secondly removing electrical power to all of the array of memory cells to reduce leakage current in the array of memory cells.

22. The method of claim 21 further comprising:
providing at least one supporting array of memory cells in either the first power plane of circuitry or the second power plane of circuitry for providing support functions to the array of memory cells, wherein when the at least one supporting array of memory cells is in the first power plane of circuitry, the supporting array of memory cells is not powered down when the second power plane of circuitry is powered down thereby keeping a record of validity status of bits in the array of memory cells.

23. The method of claim 21 further comprising:
one or more additional power planes of circuitry coupled to the first power plane of circuitry, the one or more additional power planes of circuitry comprising additional arrays of memory cells in which each additional array may be separately and completely powered down independently of whether the second power plane of circuitry is powered.

24. A method of power management in an integrated circuit comprising:
executing instructions with a processor;
providing a plurality of memory bit cells contained within a memory array, the plurality of memory bit cells being coupled to a power supply terminal for creating a first power plane;
providing memory array peripheral circuitry that is peripheral to the plurality of memory bit cells;
selectively coupling the memory array peripheral circuitry that is peripheral to the plurality of memory bit cells to the power supply terminal for creating a second power plane that is independent of the first power plane;
coupling control circuitry to the memory array peripheral circuitry that is peripheral to the plurality of memory bit cells; and
selectively removing electrical connectivity to the power supply voltage terminal of the memory array peripheral circuitry that is peripheral to the plurality of memory bit cells.

25. The method of claim 24 further comprising:

observing memory accesses of the plurality of memory bit cells during removing of electrical power to the memory array peripheral circuitry that is peripheral to the plurality of memory bit cells; and limiting powering up of the memory array peripheral circuitry that is peripheral to the plurality of memory bit cells in response to one or more memory requests until a predetermined criteria is met.

26. The method of claim 25 further comprising:

using differing predetermined criteria depending upon a sequence of instructions executed by the processor.

* * * * *

UNITED STATES PATENT AND TRADEMARK OFFICE
CERTIFICATE OF CORRECTION

PATENT NO. : 6,917,555 B2  Page 1 of 1
APPLICATION NO. : 10/675005
DATED : July 12, 2005
INVENTOR(S) : Ryan D. Bedwell et al.

It is certified that error appears in the above-identified patent and that said Letters Patent is hereby corrected as shown below:

In Column 12, Line 21, Claim No. 21:

Change "plan" to --plane--.

Signed and Sealed this

Third Day of April, 2007

JON W. DUDAS
*Director of the United States Patent and Trademark Office*